United States Patent [19]
Heitzer et al.

[11] Patent Number: 5,874,354
[45] Date of Patent: Feb. 23, 1999

[54] METHOD FOR ELECTRICALLY CONNECTING A SEMICONDUCTOR CHIP TO AT LEAST ONE CONTACT SURFACE AND SMART CARD MODULE AND SMART CARD PRODUCED BY THE METHOD

[75] Inventors: Josef Heitzer, Bach; Josef Kirschbauer, Blaibach; Peter Stampka, Schwandorf-Klardorf, all of Germany

[73] Assignee: Siemens Aktiengesellschaft, Munich, Germany

Related U.S. Application Data

[63] Continuation of PCT/DE96/01783, Sep. 19, 1996, published as WO97/12394, Apr. 3, 1997.

[21] Appl. No.: 48,560
[22] Filed: Mar. 26, 1998
[51] Int. Cl.[6] .................................................. H01L 21/44
[52] U.S. Cl. .......................... 438/612; 438/613; 438/617
[58] Field of Search ................... 438/613, 617, 438/455, 612, 342, 343, 211

[56] References Cited

U.S. PATENT DOCUMENTS

| | | | |
|---|---|---|---|
| 4,845,543 | 7/1989 | Okikawa et al. | 357/67 |
| 4,855,257 | 8/1989 | Kouda | 437/194 |
| 4,925,083 | 4/1990 | Farassat et al. | 228/102 |
| 5,124,277 | 6/1992 | Tsumura | 437/9 |
| 5,299,729 | 4/1994 | Matsushita et al. | |

FOREIGN PATENT DOCUMENTS

| | | |
|---|---|---|
| 0 320 244 A2 | 6/1989 | European Pat. Off. . |
| 0 397 426 A2 | 11/1990 | European Pat. Off. . |
| 36 21 917 A1 | 1/1988 | Germany . |
| 654 143 A5 | 1/1986 | Switzerland . |
| 661 816 A5 | 8/1987 | Switzerland . |

OTHER PUBLICATIONS

Patent Abstracts of Japan No. 62 123 727 (Michio et al.), dated Jun. 5, 1987.
Patent Abstracts of Japan No. 6–97350 (Mori), dated Apr. 8, 1994.
Patent Abstracts of Japan No. 2–52460 A (Eguchi), dated Feb. 22, 1990.
Patent Abstracts of Japan No. 2–139955 A (Ishibashi), dated May 29, 1990.
Patent Abstracts of Japan No. 63–199452 A (Kusanagi), dated Aug. 17, 1988.
Patent Abstracts of Japan No. 1–171259 A (Shida), dated Jul. 6, 1989.
Patent Abstracts of Japan No. 1–144631 A (Takekoshi), dated Jun. 6, 1989.

*Primary Examiner*—John F. Niebling
*Assistant Examiner*—Christopher Lattin
*Attorney, Agent, or Firm*—Herbert L. Lerner; Laurence A. Greenberg

[57] ABSTRACT

A method for electrically connecting a semiconductor chip to at least one contact surface uses a thin wire having a first end welded to the at least one contact surface and a second end connected to a contact zone of the semiconductor chip. In order to produce a good connection between the wire and the contact zone of the semiconductor chip, the second end of the wire is welded to a metal piece in the form of a wedge which is disposed on the contact zone of the semiconductor chip and is connected in a conductive manner thereto. The metal piece is formed by a nailhead contact having a free end which is guided in a loop and is connected to the nailhead by a wedge contact. A smart card module and a smart card are produced by the method.

2 Claims, 2 Drawing Sheets

Ball formation by means of EFO

Chip pad
Ball position 1

Chip pad
Negative loop movement

Chip pad
Positive loop movement

Chip pad
Wedge position 1

Wire tear-off at the wedge 1

Ball formation by means of EFO

External contact
Ball position 2

Chip pad with bump
Wedge position 2

Wire tear-off at the
wedge 2

Ball formation
by means of EFO

METHOD FOR ELECTRICALLY CONNECTING A SEMICONDUCTOR CHIP TO AT LEAST ONE CONTACT SURFACE AND SMART CARD MODULE AND SMART CARD PRODUCED BY THE METHOD

CROSS-REFERENCE TO RELATED APPLICATION

This application is a continuation of International Application PCT/DE96/01783, filed Sep. 19, 1996, which designated the United States.

BACKGROUND OF THE INVENTION

Field of the Invention:

The invention relates to a method for electrically connecting a semiconductor chip to at least one contact surface through the use of a thin wire having a first end welded to the at least one contact surface and a second end welded to a metal piece disposed on a contact zone of the semiconductor chip and connected thereto in a conductive manner.

Such methods are carried out in a known way by bonding. It is customary in such a case to guide the gold wire, which is usually about 24 µm thick, in a capillary, at the end of which a piece of the gold wire juts out. The piece jutting out is melted through the use of a hydrogen flame or an electrically ignited spark, with the result that the piece is formed into a small ball. The ball is then pressed onto a first contact surface through the use of the capillary and in the process is connected to the contact surface as a result of capillary vibrations in the ultrasonic range, producing a form of the gold wire which is designated as a nailhead. In the case of so-called thermo-sonic bonding, the contact surface is additionally heated to a temperature of about 200° C. to 300° C. Subsequently, the capillary is moved upwards again and is guided in an arc, the so-called loop, to a second contact surface which is to be connected to the first contact surface. At that point the capillary is lowered again and pinches off the gold wire on the second contact surface. The relatively high pressure produces a good connection between the gold wire and the second contact surface, with the resulting wedge structure being designated as a wedge. That type of bonding is also referred to as ball-wedge bonding, in contrast to wedge-wedge bonding of the type which is customary with aluminum wires.

When connecting semiconductor chips to contact surfaces, the ball is usually connected to the semiconductor chip and the wedge to the contact surface, since the ball can be better positioned and the resulting nailhead has a more precisely defined size than the wedge. In addition, the risk of destroying structures on the semiconductor chip is very low in the ball-on-chip method. However, that procedure has the disadvantage that the loop turns out to be relatively large, although that is not important with customary semiconductor housings.

However, in the case of smart cards, for example, the housing height, which corresponds to the thickness of the smart card, is very small and fixedly predetermined. If in that case a component, for example the carrier, is of a somewhat thicker construction, that additional space requirement must be saved again by a reduction at another point.

It is known from German Published, Non-Prosecuted Patent Application DE 36 21 917 Al to connect the wire first of all to a contact surface and then to the semiconductor chip. Since that procedure provides the nailhead contact on the contact surface and the wedge contact on the contact zone of the semiconductor chip, a small loop height is produced. However, there is the risk of a short circuit with the chip surface due to the shallow angle at which the wire is guided onto the contact zone of the chip. In addition, the proportion of gold in the gold/aluminum joining zone (contact zones of semiconductor chips usually are formed of aluminum) is distinctly less than in a nailhead contact. As a result, the gold is demonstrably converted completely into brittle intermetallic phases, resulting in contact detachment or contact isolation.

European Patent Application 0 397 426 A2 discloses a configuration in which, before a wedge contact is provided on a contact surface of the semiconductor chip, a nailhead contact is applied to that contact surface and the wedge contact is first provided on that nailhead contact. That increases the reliability of the connection.

The nailhead contact yields the same metallurgical conditions as is the case with traditional thermo-sonic nailhead contact-making.

However, the planar guidance of the bonding wire over the chip surface, particularly when the contact zone is situated in the inner region of the chip surface, may result in contact between the bonding wire and the edge of the semiconductor chip, which can lead to a short circuit.

Japanese Patent Abstract 6-97350 (A) from Patent Abstracts of Japan, E-1574 Jul. 6, 1994, Vol. 18, No. 359 discloses an electrical connection of a semiconductor chip to a lead frame which has a contact element in the form of a wedge, to which a wedge contact is applied in order to achieve better guidance of the bonding wire. However, the contact element in the form of a wedge is an individual part which is complicated to produce and must be disposed on the lead frame in a special method step.

SUMMARY OF THE INVENTION

It is accordingly an object of the invention to provide a method for electrically connecting a semiconductor chip to at least one contact surface and a smart card module and a smart card produced by the method, which overcome the hereinafore-mentioned disadvantages of the heretofore-known methods and devices of this general type and in which suitable guidance of a bonding wire is ensured in conjunction with a simple mounting procedure.

With the foregoing and other objects in view there is provided, in accordance with the invention, a method for producing an electrical connection between a semiconductor chip and at least one contact surface with a thin wire, which comprises attaching a nailhead contact to a contact zone of a semiconductor chip; guiding a free end of a nailhead contact wire in a loop; forming a wedge contact from the free end guided in the loop and connecting the wedge contact to the nailhead contact to form a wedge-shaped metal piece disposed on and conductively connected to the contact zone of the semiconductor chip; bonding a first end of a thin wire to at least one contact surface; and bonding a second end of the thin wire to the wedge-shaped metal piece.

In accordance with another mode of the invention, there is provided a method which comprises placing the semiconductor chip and the at least one contact surface on a common carrier.

With the objects of the invention in view, there is also provided a smart card module or a smart card, comprising at least one contact surface; a semiconductor chip having a contact zone; a nailhead contact attached to the contact zone of the semiconductor chip, the nailhead contact having a nailhead contact wire with a free end guided in a loop; a wedge contact formed from the free end guided in the loop and connected to the nailhead contact to form a wedge-shaped metal piece disposed on and conductively connected to the contact zone of the semiconductor chip; and a thin wire having a first end bonded to the at least one contact surface and a second end bonded to the wedge-shaped metal piece.

By virtue of the metal piece in the form of a wedge, which is formed by a nailhead contact having a free end that is guided in a loop and is connected to the nailhead as a wedge contact, the loop of the bonding wire which connects the semiconductor chip to the contact surface is guided upwards at an angle from the surface of the semiconductor chip in the direction of the chip edge, with the result that contact with the edge cannot occur.

Other features which are considered as characteristic for the invention are set forth in the appended claims.

Although the invention is illustrated and described herein as embodied in a method for electrically connecting a semiconductor chip to at least one contact surface and a smart card module and a smart card produced by the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
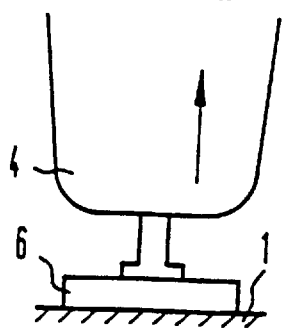
FIGS. 1a to 1f are fragmentary, diagrammatic, sectional views showing six successive individual method stages for producing a metal piece in the form of a wedge according to the invention.
Figure 1B:
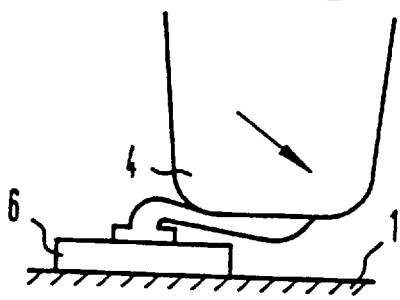
Figure 1C:
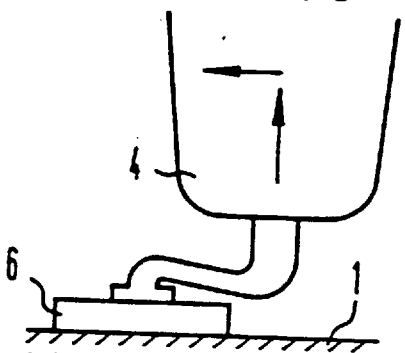
Figure 1D:
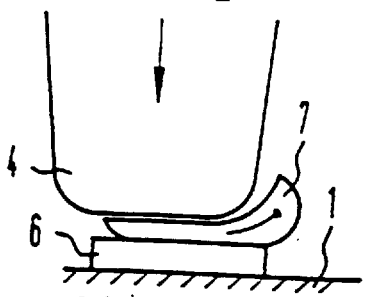
Figure 1E:
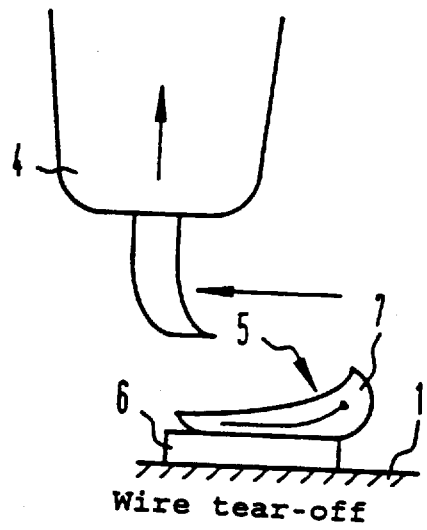
Figure 1F:
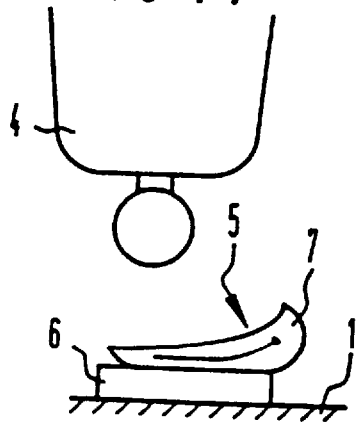

Referring now to the figures of the drawings in detail and first, particularly, to FIG. 2 thereof, there is seen a gold wire having a diameter of about 24 µm that is guided through the use of a capillary 4 onto a contact zone which is provided therefor on a semiconductor chip 1. A ball had been formed at an end of the capillary by brief liquefaction of the gold wire. An arrow indicates a direction of movement of the capillary 4. In FIG. 2a, the ball has been pressed onto the contact zone and formed into a nailhead 6. A thermosonic process may, for example, be used for this purpose. After this process, as can be seen in FIGS. 1b to 1d, the capillary 4 moves with the gold wire in a loop and pinches off a free end on the nailhead 6, as a result of which the loop is deformed into a wedge 7. An end of the gold wire is then melted again to form a ball. In this way, a metal piece 5 in the form of a wedge, including a nailhead contact 6 and a pinched wire loop 7, has been formed on the contact zone of the semiconductor chip 1.

FIGS. 2a to 2d show a portion of a smart card module. Such a smart card module is inserted into a recess in a plastic card, thus obtaining a smart card. A glass epoxide plate 3 is provided on one side with a copper laminate 2 and forms a carrier. A hole for a contact surface is provided in the glass epoxide 3 of the carrier. The chip 1 is bonded to the glass epoxide 3.

Figure 2A:
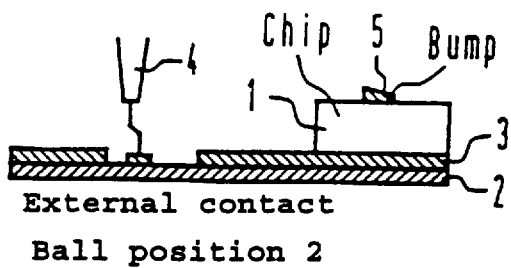
FIGS. 2a to 2d are sectional views showing four successive individual method stages for producing a configuration according to the invention.
Figure 2B:
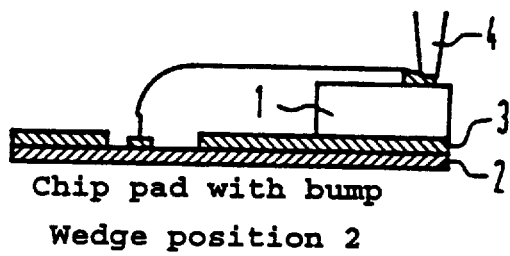
Figure 2C:
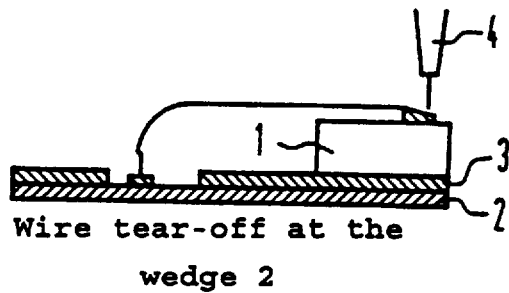
Figure 2D:
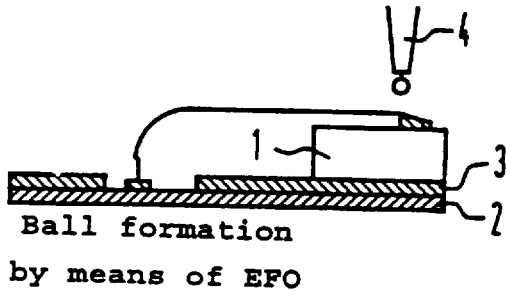

FIG. 2a shows that the gold wire has been formed into a nailhead contact through the use of the capillary 4 on the contact surface. After that step, as can be seen in FIG. 2b, the capillary 4 moves with the gold wire towards the chip 1 again and settles on the metal piece 5 which is in the form of a wedge on the contact zone of the chip 1 and pinches off the gold wire there. The capillary 4 is subsequently guided away upwards, as is indicated in FIG. 2c. Finally, it can be seen in FIG. 2d that the gold wire is applied through the use of a wedge connection to the nailhead contact situated on the contact zone of the semiconductor chip surface, and that a new ball has already formed at the end of the capillary 4. Due to the metal piece 5 in the form of a wedge, which is formed by a nailhead contact and a pinched conductor loop provided thereon according to FIGS. 2a to 2d, the gold wire for connecting the semiconductor chip 1 to a contact surface is admittedly still guided almost parallel to the semiconductor chip surface, with the result that the gold wire has a small loop height, yet the risk of the wire touching the chip edge is eliminated by virtue of the wire being guided so that it rises slightly from the chip surface.

In comparison with the aluminum-wedge bonding method, which can also be used to produce very small loop heights, this method affords the advantage of ensuring that the time for drawing a wire is significantly shorter (by approximately a factor of 2).

The configuration according to the invention and the method according to the invention can, of course, also be used and applied in an equivalent manner with differently constructed carriers for smart card modules as well as with different housing variants for semiconductor components.

We claim:

1. A method for producing an electrical connection between a semiconductor chip and at least one contact surface with a thin wire, which comprises:

attaching a nailhead contact to a contact zone of a semiconductor chip;

guiding a free end of a nailhead contact wire in a loop;

forming a wedge contact from the free end guided in the loop and connecting the wedge contact to the nailhead contact to form a wedge-shaped metal piece disposed on and conductively connected to the contact zone of the semiconductor chip;

bonding a first end of a thin wire to at least one contact surface; and bonding a second end of the thin wire to the wedge-shaped metal piece.

2. The method according to claim 1, which comprises placing the semiconductor chip and the at least one contact surface on a common carrier.

* * * * *

UNITED STATES PATENT AND TRADEMARK OFFICE
CERTIFICATE OF CORRECTION

PATENT NO. : 5,874,354
DATED : February 23, 1999
INVENTOR(S) : Josef Heitzer et al.

It is certified that error appears in the above-identified patent and that said Letters Patent is hereby corrected as shown below:

<u>Title page,</u>
Item [30] should read as follows:

-- Sept. 26, 1995      (DE) .......... 195 35 775.2 --

Signed and Sealed this

Fourteenth Day of May, 2002

Attest:

JAMES E. ROGAN
*Attesting Officer*     *Director of the United States Patent and Trademark Office*